United States Patent [19]
Baker et al.

[11] Patent Number: 5,495,238
[45] Date of Patent: Feb. 27, 1996

[54] INDUCTION WATT-HOUR METER NON-INTRUSIVE AND CONCEALED PULSE INITIATOR

[75] Inventors: Steven A. Baker, Duluth, Ga.; Marinus Hartman, Pickering; Marc M. Purc, Islington, both of Canada

[73] Assignee: Schlumberger Canada Limited, Toronto, Canada

[21] Appl. No.: 33,229

[22] Filed: Mar. 18, 1993

[51] Int. Cl.[6] .................................................. G01R 21/00
[52] U.S. Cl. .......................... 340/870.02; 324/96; 324/74
[58] Field of Search ........................ 340/870.02; 324/157, 324/156, 96, 74, 142; 280/231.17, 239

[56] References Cited

U.S. PATENT DOCUMENTS

| | | | |
|---|---|---|---|
| 3,268,884 | 10/1962 | Yanis et al. | 340/870.02 |
| 3,943,498 | 3/1976 | McClelland, III et al. | 340/870.02 |
| 4,121,147 | 10/1978 | Becker et al. | 324/157 |
| 4,491,789 | 1/1985 | Benbow | 324/157 |
| 4,783,623 | 11/1988 | Edwards et al. | 340/870.02 |
| 4,803,484 | 2/1989 | Schutrum et al. | 340/870.02 |
| 4,881,070 | 11/1989 | Burrowes et al. | 340/870.02 |
| 4,904,995 | 2/1990 | Banner et al. | 340/870.02 |
| 4,922,187 | 5/1990 | Beverly, II | 340/870.02 |
| 5,014,213 | 5/1991 | Edwards et al. | 340/870.02 |
| 5,089,771 | 2/1992 | Tanguay et al. | 340/870.02 |

*Primary Examiner*—James J. Groody
*Assistant Examiner*—Glenton B. Burgess
*Attorney, Agent, or Firm*—Keith G. W. Smith

[57] ABSTRACT

An electro-mechanical induction watt-hour meter has a rotatable disc and a projection on the base directed into the meter terminating in proximity of the rotatable disc. The projection is part of a pulse initiator system where a pulse signal is transmitted through a selected area of the base that is transparent to the signal. A signal is generated externally of the meter and chopped by rotation of the disc providing a pulse signal that passes through the base of the meter to a receptor external to the meter. The signal generator and the pulse signal receptor are both located in the enclosure defined by the base of the meter and the receptacle socket for the meter. The generated signal is disclosed as a light beam that, by way of light guides on the meter base, is directed to one side of the rotating disc and is directed by one light guide and to the other side of the disc where another light guide returns the chopped or pulsed signal to the receptor.

13 Claims, 4 Drawing Sheets

INDUCTION WATT-HOUR METER NON-INTRUSIVE AND CONCEALED PULSE INITIATOR

FIELD OF THE INVENTION

The invention relates generally to electromechanical induction watt-hour meters and particularly to generating pulse signals correlated to the rate of electrical power usage of such meters.

The invention is particularly directed to a pulse signal generator. This pulse signal generator is located near the rotatable disc of a watt-hour meter at a position where the disc is in near proximity to the base of the meter. A pulse signal, intercepted by the rotation of the disc, is passed through a portion of the meter base that is transparent to such signal. A receptor for the pulse signal is physically located in a secure location such as within the socket on which the electro-mechanical induction watt-hour meter is mounted.

BACKGROUND OF THE INVENTION

Watt-hour meters, most commonly used as electric energy billing meters, are simple induction electromechanical meters. These meters have proven to have a high degree of accuracy and reliability through many years of service under varying ambient operating conditions. The reliability of these meters is exemplified by the fact that accrediting authorities in countries such as Canada require only sample testing of meters after which the meters can be sealed for a period of twelve years. This seal can be indefinitely extended for periods of up to eight years, depending upon the accuracy criteria of the testing.

The watt-hour meter includes a motor, a magnetic brake and a register. The torque of the motor is proportional to the power flowing through it. The magnetic brake is used to retard the speed of the motor in such a way that the rotation speed is proportional to the power flowing through it (by making the braking effect proportional to the speed of the rotor). The register is used to count the number of revolutions the motor makes. The rotor portion of the meter motor is an electrical conductor in the form of a disc which is placed between the pole faces of the stator. Magnetic fluxes induce emf's in the disc which cause eddy currents that react with the alternating magnetic field, causing torque on the disc. Since the disc is free to turn, the torque causes it to rotate. Since the torque tends to cause constant acceleration, brake magnets are placed around the disc. The strength of the magnet is chosen so that the retarding torque will balance the driving torque at a given speed.

More complex forms of such meters are electronic meters using solid-state electronic circuits. These meters have the advantage of providing greater varieties of modes of measuring operations, including measurements of different parameters of electric energy consumption such as, for example, periods of "peak" and "off peak" periods of usage. Electronic meters also provide the advantage of remote reading, for example, by land lines (either power transmission lines or telephone lines).

A meter of intermediate complexity is an electromechanical meter with electronic components associated therewith and which normally are mounted inside the meter housing.

The latter two meters are not as reliable as simple electro-mechanical meters. This is exemplified by the fact that accrediting authorities in Canada require each meter to be tested and then only allow them to remain in the field for a maximum period of six years, after which time they must each be removed and reverified before being returned to the field for further use. This creates a much higher operating cost for the electric utility companies.

Solid-state electronic circuit billing meters, electro-mechanical induction billing meters and the latter form of meters incorporating electronic circuits are all required to perform in the same ambient environments and all physically have a transparent cup-shaped cover attached to a base which together form an enclosure for the operating mechanism. In all three instances the base is the same and attaches to existing meter sockets of common construction.

There is a growing demand for electricity, and existing electric utilities forecast a supply shortage by the year 2000. This shortage leaves them three options: either (a) create new generating facilities, (b) purchase power from independent producers, or (c) conserve energy. One or more of these three alternatives may be implemented by electrical utilities. Instead of adding new generating facilities to meet the growing demand for electricity, most utility companies consider it more economical to provide incentives for their customers to modify their electricity usage habits. This approach, by conserving electricity, postpones the need for new generating facilities.

Electric utilities use a process called "Demand Side Management" (DSM) to influence their customers' use of electricity in ways that produce the desired changes in the utilities' electric loads. Electric utilities view DSM as an alternative to the creation of additional generating capacity, however, DSM requires a good understanding of how and why customers use electricity. Electric Utilities are therefore undertaking to gather this information and are using creative rate structures in order to motivate customers to reduce their electric energy consumption. Since the electricity meter is typically a utility's only means of measuring a customer's electric energy usage, varying rate structures are only effective if a meter is capable of correlating the data and making this data available readily and in a useable form. This means that the utilities require more than plain residential watt-hour meters for multi-rate, prepayment, time-of-use and various other functions and measurements.

Enhancing the function of a residential meter traditionally required the addition of application-specific electronics to the meter. This resulted in a sophisticated, highly specialized, and thus expensive meter. Furthermore, the expensive meter would replace and displace a perfectly operational plain meter. It is also noteworthy that such meter replacement involves ongoing updating of detailed meter tracking records.

For the purpose of surveys and/or continued use of additional functions it is not necessarily economic or cost effective to replace traditional reliable electro-mechanical meter with solid state meters.

Examples of multi-function watt-hour meters may be found in U.S. Pat. Nos. 4,881,070, 4,465,970 and 5,014,213.

U.S. Pat. No. 4,465,970 discloses a programmable time-of-use metering system that includes a micro-processing unit incorporating a micro-processor with data input being pulses from a watt-hour meter.

U.S. Pat. No. 5,014,213 discloses a meter that records time-of-use utilizing an electronics module, a power module and a sensor assembly, all of which are located within the meter enclosure provided by the transparent cup-shaped cover that is secured to a base. They disclose optical communication with the electronics module through an optical port, in the transparent cover, to retrieve information by a meter reader from the micromemory.

U.S. Pat. No. 4,881,070 discloses a mechanism within the meter for reading the dials producing output signals for transmitting such readings and other information to a remote location. Related to this is the disclosure of U.S. Pat. No. 4,803,484.

Remote meter reading and transmission of other information from electric meters over the electric power distribution network to a central site is disclosed in U.S. Pat. No. 4,904,995. The patentee discloses a remote transponder unit located within the enclosure of the meter for obtaining information represented by the data from the measuring means of the meter and connection of that transponder unit to the electric distribution system by way of the meter.

U.S. Pat. No. 4,491,789 discloses enhancing the functions of an energy metering meter by incorporating, within the meter enclosure, components which connect to a pulse initiator that responds to rotation of the disc of the meter. The patentee indicates that either a mechanical or electromechanical pulse initiator may be used with the rotating disc or alternatively a solid state pulse initiator may be used eliminating the need for a disc.

In the foregoing patented apparatus enhancement of the meter function is accomplished by incorporating additional mechanisms within the meter. This has the disadvantage of shorter approval periods by the accredited authorizing authorities. They do, however, indicate a desire for retrofitting or maintaining the integrity of the simple electromechanical portion of the meter.

U. S. Pat. No. 3,268,884 discloses apparatus for transmitting data from a meter to a remote location by way of telephone lines and utilizes a shaft angle encoder assembly.

As discussed herein before there are disadvantages to enhancing watt-hour meters by incorporating electronic circuits within the meter.

It is thus most desirable to separate the electronics from the conventional electro-mechanical portion of the watt-hour meter but at the same time have a signal generated with a predetermined relationship to the rate of electrical power usage.

Enhancing the function of an electro-mechanical watt-hour meter without incorporating additional apparatus within the meter is known as exemplified by U.S. Pat. Nos. 4,415,853, 4,922,187 and 4,646,003. U.S. Pat. No. 4,646,003 discloses apparatus for verifying the accuracy of a meter and includes, externally of the meter, means for generating a pulse signal responsive to rotation of the disc. A light generating source external to the meter and a light receiving means external to the meter are arranged so that the light beam from the source to the receiver is chopped by the revolving disc which has an aperture near the periphery of the disc that comes into and out of alignment with the beam as the disc rotates. The viewing of the disc is done through the glass cover of the meter. The light generating source and receiver is mounted on arms extending from a casing positionable as an intermediate housing between the meter and the meter receiving socket.

U.S. Pat. No. 4,922,187 discloses a pulse initiator circuit for utility meters where the pulse initiator is attachable to the meter without breaking the meter seal. The pulse initiator circuit detects sensor holes in the watt-hour meter rotor. A source of radiation positioned outside of the watt-hour meter directs a beam toward a receiver and the beam impinges upon the rotor except when aligned with a hole in the rotor. This causes a pulse signal having a predetermined relationship to the rate at which the rotor turns. In the patented structure the light radiating and receiving source is mounted in an annular ring that fits onto the glass cover of the meter.

U.S. Pat. No. 4,415,853 discloses a scanner device mounted so as to detect the presence of a marking on the rotating disc and therefrom generate a pulse signal. In this patented structure, as in the two previously mentioned patented structures, the light source and receiver are of considerable distance from the rotating disc by virtue of the fact they are external to the meter cover. They are furthermore located in the vicinity of the glass cover making them susceptible to extraneous radiation source signals. Also by virtue of the fact they are located in surrounding relation to the exposed part of the meter they are subjected directly to ambient conditions as well as being prone to vandalism or unwanted manipulation.

A further form of pulse initiator is disclosed in U.S. Pat. No. 3,943,498.

In all of the foregoing, the pulse initiator is either disposed internally of the meter along with other electronic components to enhance the meter's function or is located externally of the meter at a position forwardly of the base of the meter in proximity to the glass cover.

Since the traditional residential meters are very reliable and economical it is not cost effective to replace them with solid state meters at present. Hence, enhancing a meter's function involves counting the meter's disc revolutions and using a micro-processor to manipulate this information to produce the rate structures or features required. Adding these electronics to a meter reduces the meter life in the field. At present a plain electromechanical meter is expected to last 30 to 45 years while the life of an electronic meter is substantially less. Adding electronics also increases the amount of testing required by regulatory authorities to verify the calibration (seal) with each meter having to be done individually.

An object of this invention is to provide means external to a simple electro-mechanical meter for initiating a pulse in response to the disc revolutions but which is disposed in a secure location and in close proximity to the rotating disc.

SUMMARY OF THE INVENTION

In accordance with this invention, sensing of the meter disc rotation is achieved through the meter base thereby disposing the sensing means in close proximity to the rotating disc while at the same time being disposed externally of the meter and in a secure and safe location.

In accordance with this invention, there is provided an electro-mechanical watt-hour meter with a pulse initiator responsive to rotation of the meter disc wherein apparatus for the initiator is located on the base of the meter. This locates the initiator in a more secure place as it is in an enclosure provided by the meter base and the service box on which the meter is mounted. This position also eliminates the need to expose communication wires etc., thus preventing others from tampering with them and also protecting the wires from direct environmental elements. Sensing revolutions of the disc is done through the meter base and thus a portion of the base becomes a "window" to the pulse signals generated by the disc motion regardless of the method of sensing. Optical sensing is disclosed hereinafter but obviously other sensing systems such as capacitive, inductive or magnetic coupling or radioactive communication may be used if so desired.

The meter base is designed to accept a "window" in the shape of dual light-guides, the protruding ends of which face inside the meter and are positioned on either side of the rotatable disc. Since the dual light-guides are molded from a single piece of acrylic, they have a common base which forms the window. Shining a beam of light into the lower half of the "window" the light is reflected from the protruding end of the lower light-guide, across the gap, onto the reflecting surface of the protruding end of the upper light-guide. From this surface the light is reflected back out of the upper half of the "window". A light receptor (photo-transistor) is positioned against the upper half of the "window" to detect this returning beam of light. If the meter disc is positioned in the gap between the protruding light-guides then the beam of light will be blocked. Holes, properly positioned in the periphery of the disc, will allow the beam of light to pass across the gap as the disc rotates. In this way both the rotation and rate of rotation of the disc can be detected. A single hole in the disc may be used to produce one pulse per disc revolution, or a number of holes spaced circumferentially in a ring may be used. Increasing the number of holes, increases the measurement resolution, and ten equally spaced holes are proposed, offering a measurement resolution of 1/10 of a disc revolution.

The light guide piece may be inserted in an aperture in the base after the base has been formed or the base may be molded around the light guide piece or the two may be formed simultaneously.

The "window" becomes an integral part of the meter base, complying with the profile restrictions for meter bases as required, for example, by the Canadian Standards Association (CSA). Since the light source (light emitting diode), receptor (photo-transistor) and all controlling electronics reside outside of the meter, the integrity of the plain electro-mechanical meter is not compromised.

An adapter called an interbase (such as disclosed in U.S. Pat. No. 4,121,147) may be used as a housing for the pulse-pickup electronics along with whatever other circuits may be required to manipulate the pulse data to perform the appropriate functions and features. The interbase is a socket-to-socket adapter which plugs into the service box and, in turn, has the meter plugged into it. The current terminals in the interbase simply extend those of the service box to meet the meter while providing the space to house the electronics and access to line voltage in order to power the electronics. The interbase may have a chamber which extends below the profile of the meter. This chamber can be equipped with a door, a wire trap and/or knock-outs. Each of these offer alternate methods of accessing the interbase electronics. For example, the interbase may be equipped with a modem for communication of the metering data directly to an electric utility. The wire trap provides secure access for a telephone cable to tie into the lower chamber of the interbase. Once inside the lower chamber of the interbase a wire can be routed directly to an appropriate connector on the circuit board. Alternately, a strip holding a number of terminal connectors may be provided in the lower chamber as a common point to connect wires and cables for communication outside the interbase, and hence outside the meter.

There is particularly provided, in accordance with this invention, pulse initiating apparatus responsive to energy consumed as measured by an electro-mechanical induction watt-hour meter that includes a cover, a base, and a disc that rotates at a rate proportional to the energy being consumed, such disc having a peripheral edge in proximity of the base, the improvement comprising locating a device for use in generating a pulse signal near the rotatable disc at a position where the disc is in near proximity to the base and directing a generated pulse signal from said device through a selected area of the base of the meter which is transparent to the generated signal.

BRIEF DESCRIPTION OF THE DRAWINGS

The invention is illustrated by way of example in the accompanying drawings wherein:

FIG. 7(a–e) is a diagrammatic illustration of different rotational positions of the disc and a hole therein chopping the light beam.

DESCRIPTION OF THE PREFERRED EMBODIMENTS

Figure 1:
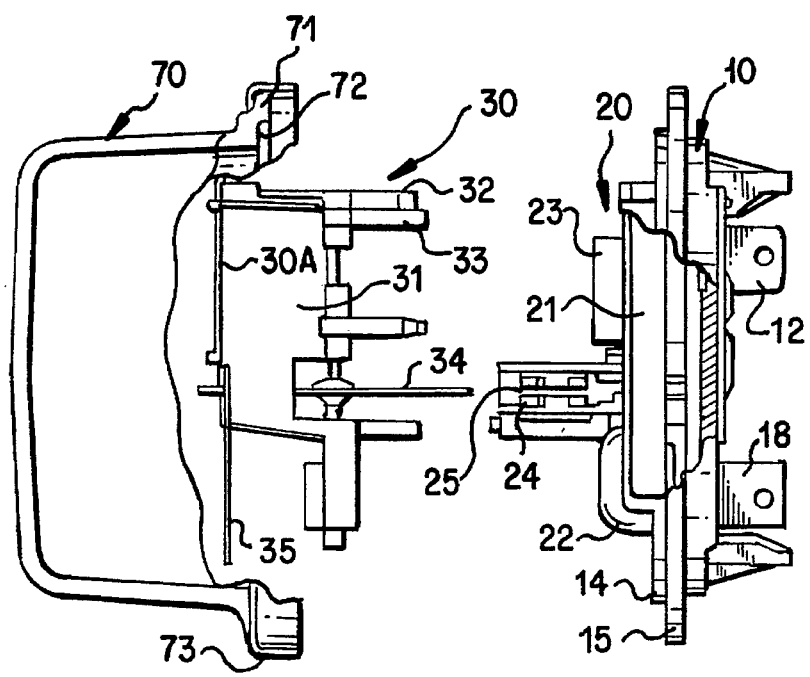
FIG. 1 is an exploded side-elevational view illustrating the major components of the electro-mechanical watt-hour meter.
Figure 2:
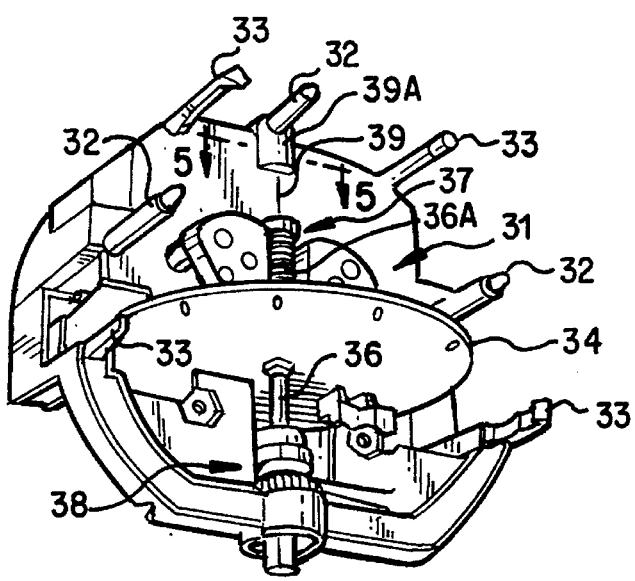
FIG. 2 is an oblique view of the register housing and rotatable disc portion of the meter illustrated in FIG. 1.

FIG. 1 is an exploded view of an electromechanical induction watt-hour meter, the major components of which are a molded base 10, an electromagnetic coil unit 20 with a disc brake magnet mounted thereon, a register and rotor unit 30, and a glass cover 70.

The electromagnetic coil unit 20 has a core unit 21 with respective current and potential coils 22 and 23 mounted thereon. A magnetic brake 24 is carried by electromagnetic coil unit 20 and has a gap 25 for receiving a portion of the rotor. Electromagnetic coil unit 20 securely attaches to molded base 10 and has pairs of current spades 11 and 12 projecting through and anchored to the base. The base and spade attachments thereto are the subject of a separate U.S. Pat. No. 5,364,290, issued Nov. 15, 1994, filed concurrently herewith, the disclosure of which is incorporated herein by reference. Base 10 is molded conventionally from a hard thermoset plastic material such as a phenolic resin (bakelite). The use of a rigid thermoplastic such as a polycarbonate material identified as #9417 Makrolon®, available from the Bayer Company of Germany is preferred. The polycarbonate material is preferably glass fiber reinforced and ultra-violet light stabilized. This material is somewhat more resilient than the hard phenolic bases conventionally used. Electromagnetic coil unit 20 attaches to molded base 10 in a convenient manner, for example, using lugs projecting from molded base 10 which position and snap fit onto electromagnetic coil unit 20.

The register and rotor 30 is a module that includes a molded plastic (preferably Ryton® PPS) housing 31 having a plurality of spacer lugs 32 projecting therefrom and attaching lugs 33 for precisely locating register and rotor unit 30 relative to electromagnetic coil unit 20 and attaching register and rotor unit 30 to molded base 10 with an electromagnetic coil unit 20 mounted thereon. Register and rotor unit 30 has a register, diagrammatically illustrated by its face 30A, driven through a gear train by a worm gear 36A on shaft 36 of rotatable disc 34. A name plate 35 attaches to and extends downwardly from molded plastic housing 31. Locating lugs 32 position register and rotor unit 30 relative to electromagnetic coil unit 20 such that rotating disc 34 fits into gap 25 and lugs 33 snap fasten onto electromagnetic coil unit 20 and/or molded base unit 10.

Disc 34, which is caused to rotate by the electromagnetic coil unit 20 in a known manner, is mounted on a spindle or shaft 36 having respective upper and lower bearing units 37 and 38 on the molded plastic housing unit 31. The bearing units mounting the rotor are the subject of U.S. Pat No. 5,364,290, issued Nov. 15, 1994, filed concurrently herewith, the disclosure of which is incorporated herein by reference. A pintle 39, associated with upper bearing 37, projects therefrom into a pintle receiving unit 39A on molded plastic housing 31. Rotor shaft 36 has a worm gear 36A on the upper end thereof that meshes with a drive gear, not shown, for driving the gear train of the registry unit. Dials of the registry unit visually indicate cumulatively the energy consumed.

Glass cover 70 has an outwardly directed flange 71 and a seat portion 72 that abuts against a seal forming rib 14 on molded base 10. Outwardly directed flange 71 carries a metal ring 73 provided with lugs that engage tapered ramps on flange 15 of molded base 10 forming a bayonet-type mount whereby glass cover 70 and molded base 10 may be rotated relative to one another to detachably join them together with rib 14 on molded base 10 being pressed against seat 72 on the glass cover 70.

Figure 3:
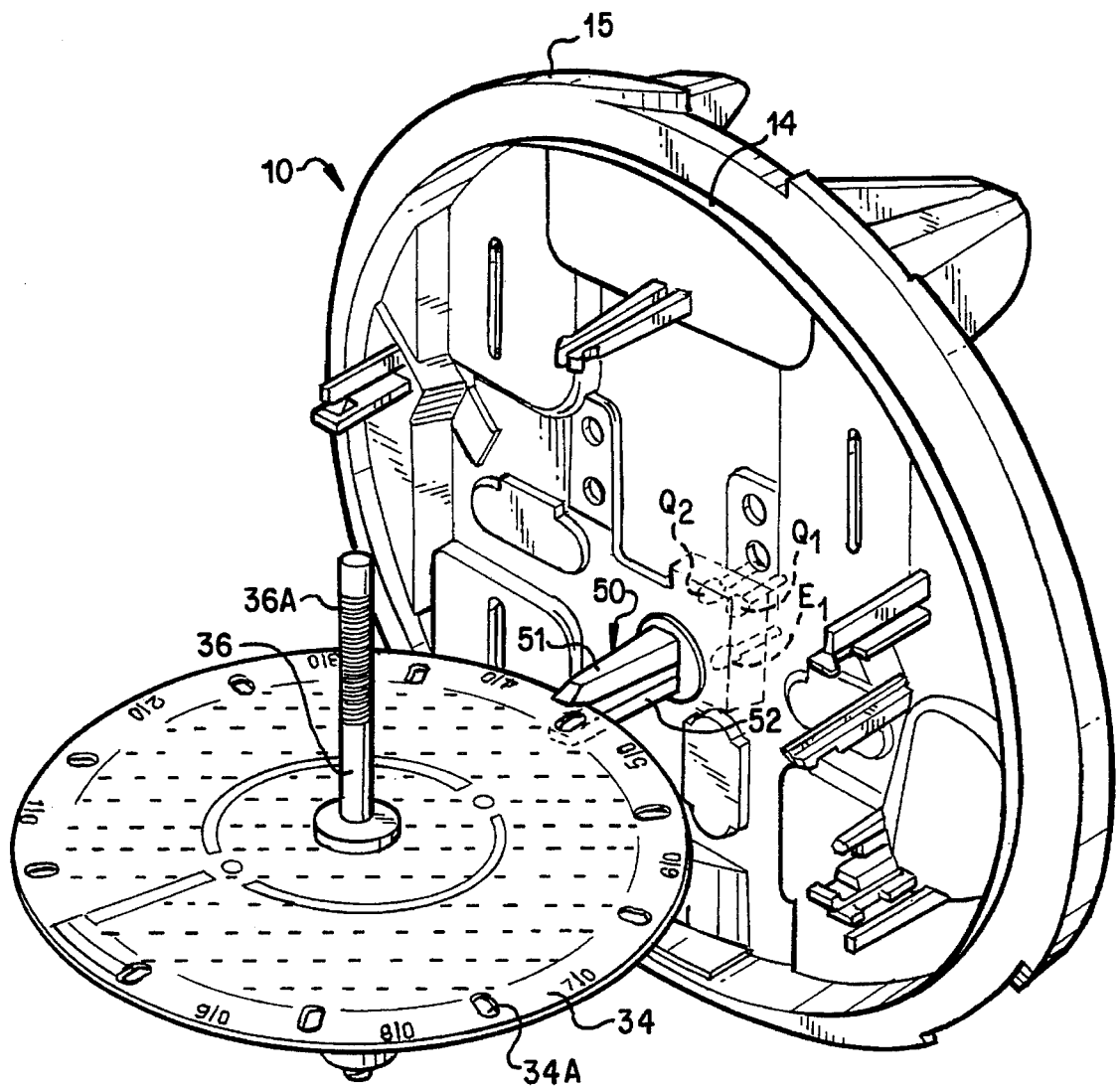
FIG. 3 is an enlarged, oblique, partial diagrammatic, view of the base of the meter without the potential and current induction coils mounted thereon illustrating co-positioning of the two prong light guide and the rotatable disc.
Figure 6:
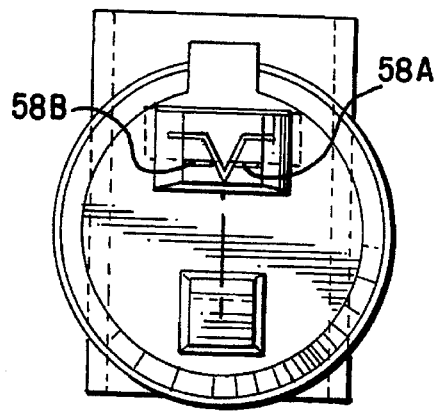
FIG. 6 is a left hand side elevational view of FIG. 5.

This application is particularly directed to an apparatus for initiating a pulse signal in response to rotation of disc 34 and to the physical location of such apparatus. FIG. 3 diagrammatically illustrates an embodiment of the invention wherein molded base 10 has a fork-type two prong light guide unit 50 mounted on molded base 10. Light guide unit 50 projects inwardly into the meter to overlap a selected peripheral portion of disc 34.

Figure 4:
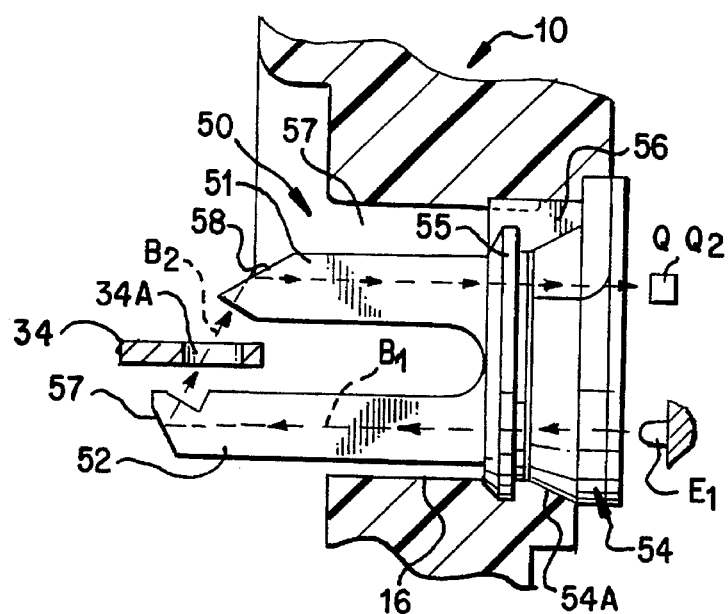
FIG. 4 is a partial side elevational view, on a larger scale, illustrating the two prong light guide.

Light guide unit 50 has an upper leg 51 and a lower leg 52 spaced a selected distance from one another providing a gap therebetween to receive a peripheral edge portion of disc 34 as will be seen more clearly from FIG. 4. Disc 34 may have a thickness of, for example, about $^{40}/_{1000}$ of an inch while the gap may be, for example, approximately $^{110}/_{1000}$ of an inch. Legs 51 and 52 project forwardly from a base 54 that has an outwardly directed rib 55 for snap fitting into a suitably shaped and formed aperture 16 in molded base 10. A sloped shoulder 54A on the base limits the inward movement of the unit when press fit in place and co-operates with rib 55 to ensure a snug fit.

Referring to FIG. 4, projecting outwardly from base 54 is a locating rib 56 that slip fits into a slot 17 in a wall of aperture 16. Locating rib 56 and slot 17 ensure appropriate positioning along with rib 55, of legs 51 and 52 relative to an aperture 34A (or series of apertures) through disc 14. As illustrated in FIG. 3, there may be only one aperture 34A, or a series of apertures 34A, equally spaced from one another in a circle around the disc and spaced inwardly from the peripheral edge thereof. One light guide leg is shorter than the other and in this embodiment lower leg 52 is longer than upper leg 51.

Figure 5:
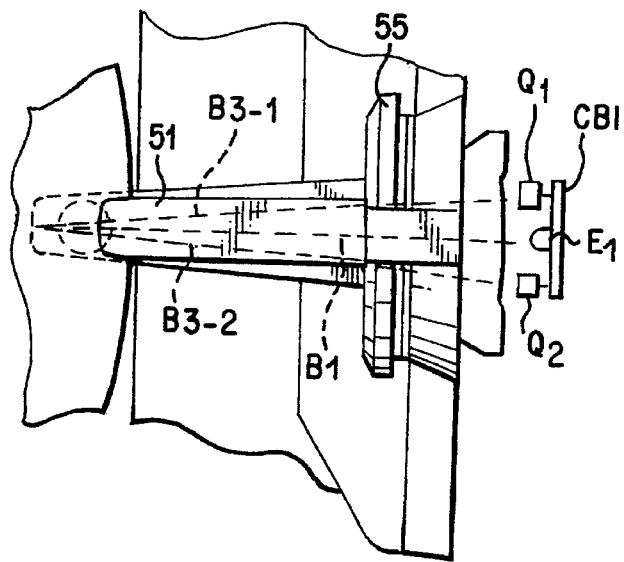
FIG. 5 is a top plan view of FIG. 4.

Diagrammatically illustrated in FIGS. 4 and 5 is a light emitting diode E1 associated with lower leg 52 for directing a beam of light B1 along leg 52. Associated with the upper leg are respective ones of a pair of phototransistor receivers designated Q1 and Q2.

Light guide unit 50 mounted on molded base 10 is a translucent light receptor-transmitter made, for example, from clear acrylic. Phototransistor receivers Q1 and Q2 and light emitting diode E1 are preferably mounted on a separate printed circuit board designated CB1 in FIG. 5 mounted in a conventional service socket or an interbase assembly inserted between the electric service socket and the meter.

Light emitted by light emitting diode E1 enters receptor-transmitter unit 50 forming a beam of light B1 transmitted on lower leg 52 toward a light reflecting surface 57 that directs the beam of light into a reflected beam B2. This reflected beam B2 is directed by a reflecting surface 58 on leg 51 resulting in a further reflected beam or beams directed to the phototransistor receptor(s) Q1 and Q2. Reflected beam B2 passes through a hole 34A in disc 34 when aligned therewith during rotation of the disc. The reflecting surface 58 on leg 51 can be either a single plane or grooved or have a projecting V-shaped rib providing respective angularly related planar faces 58A and 58B causing two reflected beams designated B3-1 and B3-2 (see FIG. 5) to travel along leg 51. The multi-faced reflecting surface 58 directs light beams B3-1 and B3-2 to respective phototransistor receptors Q1 and Q2.

Figures 7A, 7B, 7C, 7D, 7E, 8:
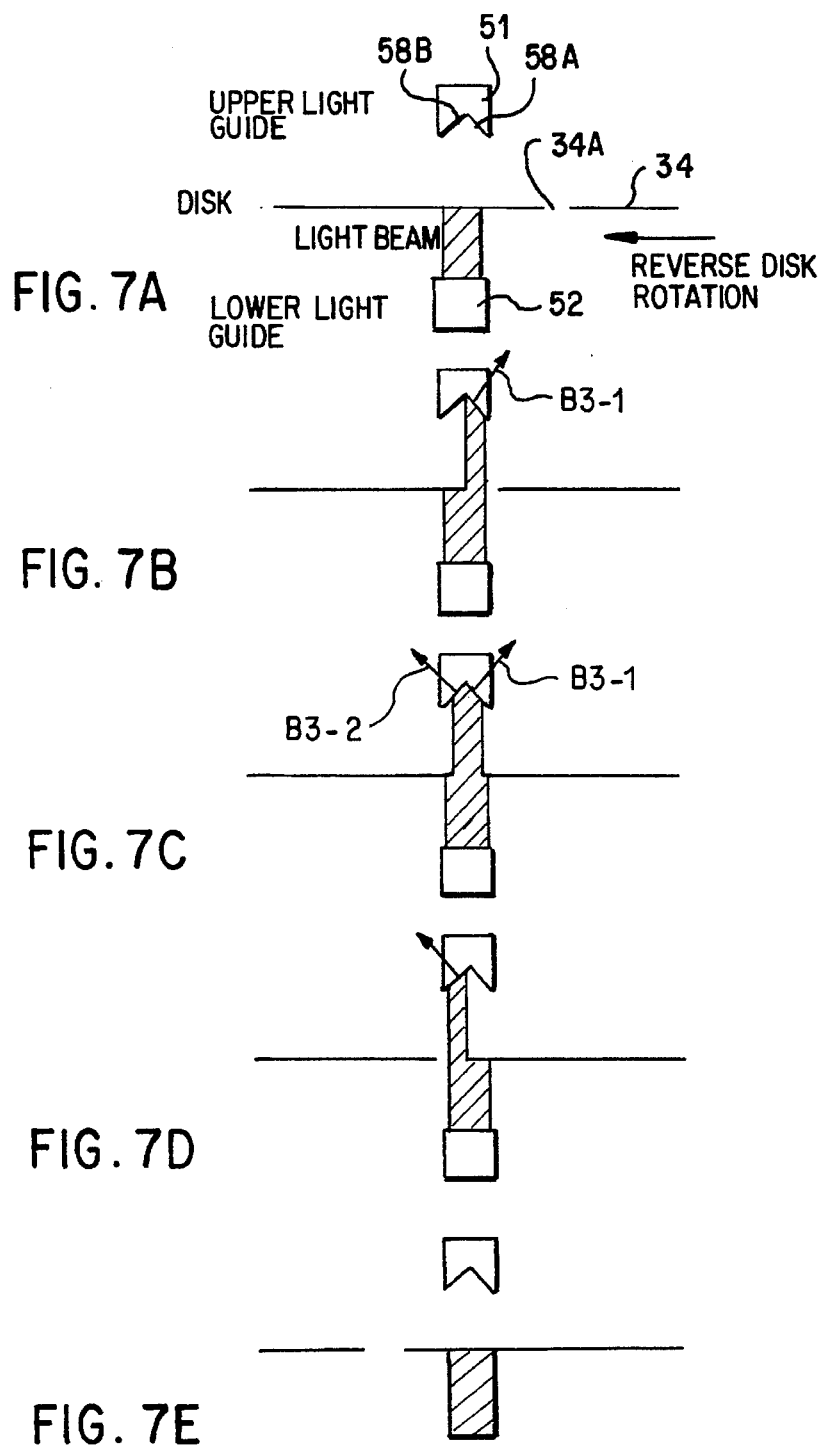
FIG. 8 is a diagrammatic illustration of the logic sequence for two receptors relative to the rotational positions for the disc shown in FIG. 7.

Since phototransistor receptors Q1 and Q2 are physically displaced from one another, the light beam generated by E1 passing through the hole will appear first on either phototransistor receptor Q1 or Q2 depending upon the direction of rotation of the disc. Additional circuity, therefore, can be used to determine the direction of rotation of the disc and hence forward or reverse energy flow. This is diagrammatically illustrated in FIGS. 7 and 8 wherein FIG. 7 diagrammatically illustrates disc 34 with hole 34A in 5 different rotational positions designated A, B, C, D and E. A representative hole 34A in disc 34 is shown moving in FIG. 7 from right to left. FIG. 8 diagrammatically illustrates the logic for respective disc positions A, B, C, D, and E for the reflected beam as viewed at respective phototransistor receptors Q1 and Q2.

Directional rotation of disc 34 is detected by the reflected light beams resulting from the slightly angled planes of reflecting surface 58. As the leading edge of hole 34A in disc 34 crosses the light beam it reveals first one reflecting surface and then both. As the trailing edge of the hole crosses the light beam it blocks the first reflecting plane and slides across to block the beam completely. In this method the phototransistor receptor pairs Q1 an Q2 see logic 0-0 as the disc completely blocks the light beam, logic 1-0 as the leading edge of the hole exposes the first reflecting plane, logic 1-1 as the light hits both reflecting planes, logic 0-1 as the trailing edge of the hole blocks light from the first reflecting surface then finally 0-0 as the hole passes and the disc again blocks the beam of light. Similarly, the same results could be achieved if the beam of light were split before it reaches the disc. In such instance the split beams would be directed onto the disc in such a manner that the hole would pass first in front of one beam then the other permitting detecting forward and reverse disc rotation.

While an optical solution has been chosen to initiate a pulse, other technologies could achieve the same results, for example, technologies such as magnetic coupling, capacitive coupling, inductive coupling and radioactive communication are possible.

Other optical solutions are also available, and, while chopping of a beam of light by the apertured disc is disclosed herein, the same effect could be achieved if the light were reflected off the surface of the disc or its outer peripheral edge. Similarly, various optical solutions could implement a range of optical wavelengths from visible to infrared and laser, infrared being preferred.

From the foregoing discussion it will be clearly evident the pulse initiator apparatus is hidden from view, is protected by being located in the mounting base and is located closely adjacent a peripheral edge of the rotary disc. There are no active components mounted within the enclosure, thereby avoiding the risk of requiring additional testing of the meter while at the same time providing means to generate information not possible with a conventional electromechanical induction watt-hour meter.

The plastic for the molded housing, pilot bearings and meter base are engineering grade resins and preferably rigid thermoplastic materials such as those identified hereinbefore.

What is claimed is:

1. A device for use with an electro-mechanical induction watt-hour meter, said meter including a cover, a base and a disc mounted to rotate at a rate proportional to an amount of energy being consumed, said disc having a peripheral edge in proximity to the base, said device comprising:

means for generating a pulse signal near the rotatable disc at a position where an edge of the disc is in proximity to the base; and means for directing the generated pulse signal through a selected area of the base of the meter which is transparent to the generated pulse signal;

wherein said device is mounted on the base of the meter and includes a projection extending away from said base and terminating at a free outer end disposed in close proximity to the rotatable disc.

2. The device as defined in claim 1, further comprising a receptor for receiving the generated signal and wherein said receptor is mounted in an enclosure defined by the base of the meter and a socket on which the meter is mounted.

3. The device as defined in claim 1, wherein a portion of said projection extends beyond the peripheral edge of said disc towards a center of said disc.

4. The device as defined in claim 1, wherein said free outer end of the projection has a gap, said gap receiving therein a portion of the peripheral edge of the disc, said gap defining an upper arm and a lower arm in said free outer end of said projection.

5. The device as defined in claim 4, including means on said disc for causing a signal, transmitted by way of said arms, to pulse in response to rotation of the disc.

6. The device as defined in claim 4, wherein said arms project from said base toward said disc and are wave guides for a light beam, said wave guides including means for directing a light beam from one arm to the other disc arm, said light beam being interrupted as the disc rotates.

7. The electro-mechanical induction watt-hour meter of claim 1 wherein said base includes a transparent cover attached thereto, which together with said base forms an enclosure containing said disc, said device further comprising:

means for passing the generated pulse signal through said base to a receptor disposed externally of the enclosure.

8. A meter as defined in claim 7, further comprising:

means located externally of the enclosure for generating a signal, means for directing said generated signal to said disc at said location, and means, associated with said disc, for interrupting said generated signal in response to the rate of rotation of said disc, producing pulse signal.

9. The meter of claim 8, further comprising:

means, associated with said disc, for interrupting said generated signal in response to the rate of rotation of said disc, thereby producing said pulse signal;

wherein said meter is mounted on a meter socket enclosure external to the meter and wherein said signal generating means and said receptor for the pulse signal are located in said meter socket enclosure.

10. An electro-mechanical induction watt-hour meter, comprising:

a transparent cover attached to a base and together forming an enclosure containing an electromechanical apparatus with a disc that rotates in proportion to an amount of energy being consumed, a peripheral portion of said disc being located in near proximity to said base;

means on said base projecting into said enclosure for generating a pulse signal responsive to a rate of rotation of said disc; and means for passing the pulse signal through said base to a receptor disposed external to the meter;

wherein a portion of said projecting means extends beyond the peripheral portion of said disc.

11. A watt-hour meter as defined in claim 10, wherein a free outer end of said projecting means has a gap receiving said peripheral portion of said disc, said gap being defining an upper arm and a lower arm of said projecting means.

12. A watt-hour meter as defined in claim 11, including means on said disc causing a signal, transmitted by way of said arms, to pulse in response to rotation of the disc at a rate proportional to said rate of rotation.

13. A watt-hour meter as defined in claim 11, wherein said arms are wave guides for a light beam and including means for directing a light beam from one arm to the other arm, said light beam being interrupted as the disc rotates.

* * * * *